(12) United States Patent
Ramsbey et al.

(10) Patent No.: US 6,566,194 B1
(45) Date of Patent: May 20, 2003

(54) SALICIDED GATE FOR VIRTUAL GROUND ARRAYS

(75) Inventors: Mark T. Ramsbey, Sunnyvale, CA (US); Yu Sun, Saratoga, CA (US); Chi Chang, Redwood City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/968,465

(22) Filed: Oct. 1, 2001

(51) Int. Cl.⁷ ............................................. H01L 21/336
(52) U.S. Cl. ...................... 438/257; 438/275; 438/276; 438/279; 438/587
(58) Field of Search ................................ 438/257, 275, 438/241, 299, 279, 776, 587; 257/324, 315

(56) References Cited

U.S. PATENT DOCUMENTS

| | | | |
|---|---|---|---|
| 4,173,766 A | 11/1979 | Hayes | 357/23 |
| 5,168,334 A * | 12/1992 | Mitchell et al. | 257/324 |
| 5,284,784 A | 2/1994 | Manley | 437/43 |
| 5,349,221 A | 9/1994 | Shimoji | 257/324 |
| 5,717,635 A | 2/1998 | Akatsu | 365/185.05 |
| 5,768,192 A | 6/1998 | Eitan | 365/185.24 |
| 5,907,171 A * | 5/1999 | Santin et al. | 257/315 |
| 5,966,603 A | 10/1999 | Eitan | 438/258 |
| 5,972,751 A | 10/1999 | Ramsbey et al. | 438/257 |
| 6,001,689 A | 12/1999 | Van Buskirk et al. | 438/266 |
| 6,023,085 A | 2/2000 | Fang | 257/315 |
| 6,025,267 A * | 2/2000 | Pey et al. | 438/299 |
| 6,030,871 A | 2/2000 | Eitan | 438/276 |
| 6,074,915 A | 6/2000 | Chen et al. | 438/258 |
| 6,130,453 A | 10/2000 | Mei et al. | 257/315 |
| 6,143,608 A | 11/2000 | He et al. | 438/264 |
| 6,153,467 A | 11/2000 | Wu | 438/257 |
| 6,153,471 A | 11/2000 | Lee et al. | 438/263 |
| 6,157,575 A | 12/2000 | Choi | 365/185.29 |
| 6,159,795 A | 12/2000 | Higashitani et al. | 438/257 |
| 6,207,492 B1 * | 3/2001 | Tzeng et al. | 438/241 |
| 6,306,713 B1 * | 10/2001 | Hu et al. | 438/257 |
| 6,372,580 B1 * | 4/2002 | Shiau | 438/275 |

OTHER PUBLICATIONS

"A True Single–Transistor Oxide–Nitride–Oxide EEPROM Device," T.Y. Chan, et al., IEEE Electron Device Letters, vol. EDL 8, No. 3, Mar. 1987.

"An Electrically Alterable Nonvolatile Memory Cell Using a Floating–Gate Structure," Daniel C. Guterman, et al., IEEE Transactions on Electron Devices, vol. ED–26, No. 4, Apr. 1979.

"NROM: A Novel Localized Trapping, 2–Bit Nonvolatile Memory Cell," Boaz Eitan, et al., IEEE Electron Device Letters, vol. 21, No. 11 Nov. 2000.

* cited by examiner

*Primary Examiner*—Hoai Ho
*Assistant Examiner*—Long Tran
(74) *Attorney, Agent, or Firm*—Amin & Turocy, LLP

(57) ABSTRACT

The present invention provides processes for doping and saliciding word lines in a virtual ground array flash memory device without causing shorting between bit lines. According to one aspect of the invention, word lines are doped prior to patterning the poly layer from which the word lines are formed in the core region. Thereby, the poly layer protects the substrate between the word lines from doping that could cause shorting between bit lines. According to another aspect of the invention, word lines are exposed while spacer material, dielectric, or like material protects the substrate between word lines. The spacer material or dielectric prevents the substrate from becoming salicided in a manner that, like doping, could cause shorting between bit lines. The invention provides virtual ground array flash memory devices with doped and salicided word lines, but no shorting between bit lines even in virtual ground arrays where there are no oxide island isolation regions between bit lines.

10 Claims, 8 Drawing Sheets

SALICIDED GATE FOR VIRTUAL GROUND ARRAYS

TECHNICAL FIELD

The present invention generally relates to fabricating nonvolatile semiconductor memory devices. In particular, the present invention relates to improved methods of fabricating flash memory devices with bit lines that can serve as sources and/or drains.

BACKGROUND

A desire for compact size and high access speed has driven the development of EEPROM (electrically erasable programmable read only memory) flash memory devices. One such development, applicable to both conventional and SONOS (silicon-oxide-nitride-oxide-silicon) flash memory devices, provides a virtual ground array structure. While a non-virtual ground array structure has dedicated source and drain regions for reading and writing operations, a virtual ground array structure reduces the spacing between gates by employing bit lines that can serve as either sources or drains according to the voltages applied.

Reducing the size of flash memory devices increases their speed, but speed can be enhanced in other ways. In a large array, speed is enhanced by reducing the spacing between contacts along bit lines. Contacts take up room and generally require a broader spacing between adjacent word lines wherever the contacts are to be placed. A compromise between the gains of more narrowly spaced contacts and the cost of having more contacts is to place contacts along the bit lines at every 16 word lines.

The response delay associated with polysilicon word lines can be reduced by siliciding, which provides lower electrical resistance. Siliciding is generally carried out without masking in what is referred to as a self-aligned siliciding process (saliciding). Unfortunately, saliciding has proven difficult in virtual ground arrays. The saliciding process has a tendency to cause shorting between bit lines, particularly in the absence of oxide island isolation regions.

In general, memory devices are faster and more compact than ever. However, there remains a demand for ever faster and/or more compact memory devices.

SUMMARY OF THE INVENTION

The following presents a simplified summary of the invention in order to provide a basic understanding of some of its aspects. This summary is not an extensive overview of the invention and is intended neither to identify key or critical elements of the invention nor to delineate its scope. The primary purpose of this summary is to present some concepts of the invention in a simplified form as a prelude to the more detailed description that is presented later.

The present invention provides processes for doping and saliciding word lines in a virtual ground array flash memory device without causing shorting between bit lines. According to one aspect of the invention, word lines are doped prior to patterning the poly layer from which the word lines are formed in the core region. Thereby, the poly layer protects the substrate between the word lines from doping that could cause shorting between bit lines. The core can be masked during subsequent doping steps that take place after patterning the poly layer in the core region.

According to another aspect of the invention, immediately prior to saliciding, word lines are exposed while spacer material, dielectric, or like material protects the substrate between word lines. The spacer material or dielectric prevents the substrate from becoming salicided in a manner that, like doping, could cause shorting between bit lines.

The invention provides virtual ground array flash memory devices with doped and salicided word lines, but no shorting between bit lines, even in virtual ground arrays where there are no oxide island isolation regions between word lines. Potential advantages of such structures include reduced size, reduced number of processing steps, and reduced exposure to high temperature cycling.

Other advantages and novel features of the invention will become apparent from the following detailed description of the invention and the accompanying drawings. The detailed description and drawings provide certain illustrative examples of the invention. These examples are indicative of but a few of the various ways in which the principles of the invention can be employed.

DISCLOSURE OF THE INVENTION

The present invention involves a process for fabricating virtual ground array flash memory devices, and in particular, a process for doping and saliciding the word lines of such devices without causing shorting between bit lines, even where oxide islands are not provided to protect the substrate between word lines. The devices have core and peripheral regions. The core region includes memory cells and the peripheral region includes low voltage gates, high voltage gates, and other input/output circuitry. The memory cells include polysilicon or amorphous silicon control gates that are connected in continuous strips to form word lines. The drains and the sources of the memory cells are connected, either in series or in parallel, to form bit lines. Using decoders and control circuitry in the peripheral region, each memory cell can be addressed for programming, reading or erasing functions. Word lines are doped and salicided to reduce the electrical response delay in performing these functions.

Figure 1:
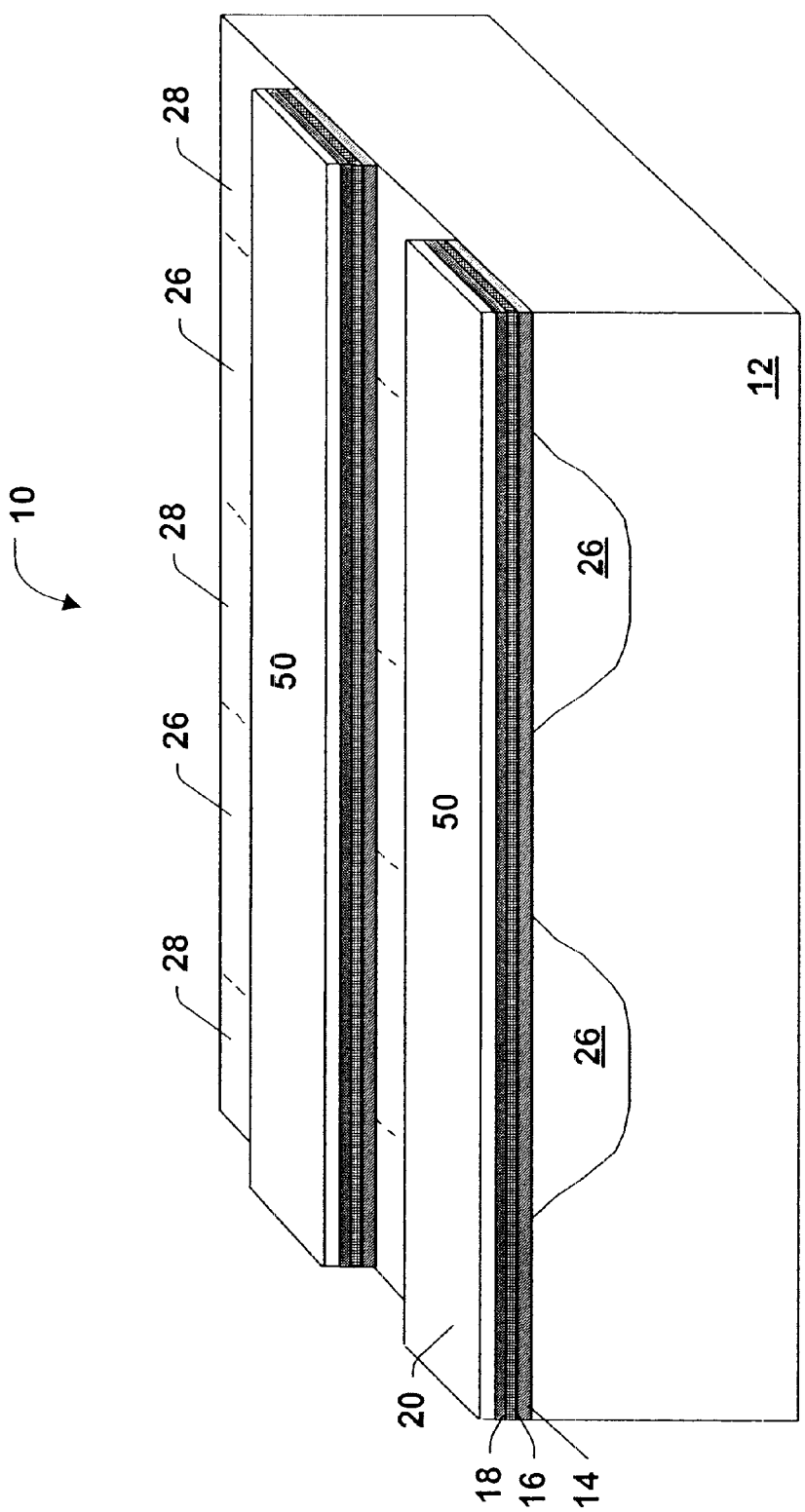
FIG. 1 is an oblique view illustration of a device according to one aspect of the present invention.

The present invention is now described with reference to the figures, wherein like features are referred to with like numbers throughout. FIG. 1 illustrate a portion of the core region of a flash memory device 10 with doped and salicided word lines according to one aspect of the present invention. The device illustrated has a NOR structure, has buried bit lines, and is of SONOS type. However the invention encompasses devices with NAND structure, bit lines that are not buried, and floating gate memory cells.

Word lines 20 of device 10 are continuous strips patterned from a doped polysilicon or amorphous silicon layer. Word lines 20 overlay charge trapping layers that include oxide layer 14, nitride layer 16, and oxide layer 18. Word lines 20 serve as control gates for memory cells 50. Memory cells 50 occur along word lines 20 between buried bit lines 26. Buried bit lines 26 include doped regions of substrate 12. These doped regions serve as sources and drains for memory cells 50. The bit lines are electrically isolated from each other by portions of substrate 12 with opposite doping from that of bit lines 26 (forming oppositely directed p-n junctions). Word lines 20 are salicided, but the substrate 12 between bit lines is essentially free of silicide, even where oxide islands are not provided to protect the substrate between word lines. Regions 28 between buried bitlines do not contain oxide islands.

Memory cells 50 can be floating gate memory cells, although in such a case at least one of the charge trapping layers is conductive and does not form continuous strips along the word lines. The portions 28 of substrate 12 between word lines 20 are generally free from oxide islands. Oxide islands are layers of dielectric material that are generally at least about 100 Å thick, and typically at least about 500 Å thick, such as formed by local oxidation of silicon (LOCOS) or shallow trench isolation (STI). Prior art memory devices commonly have oxide islands formed in spaces between word lines. These islands are provided at locations where they facilitate maintaining electrical isolation of bit lines. For example, oxide islands may be placed between bit lines to protect portions of the substrate that serve to electrically isolate adjacent bit lines. Oxide islands are generally unnecessary in devices made according to processes of the present invention.

Figure 2:
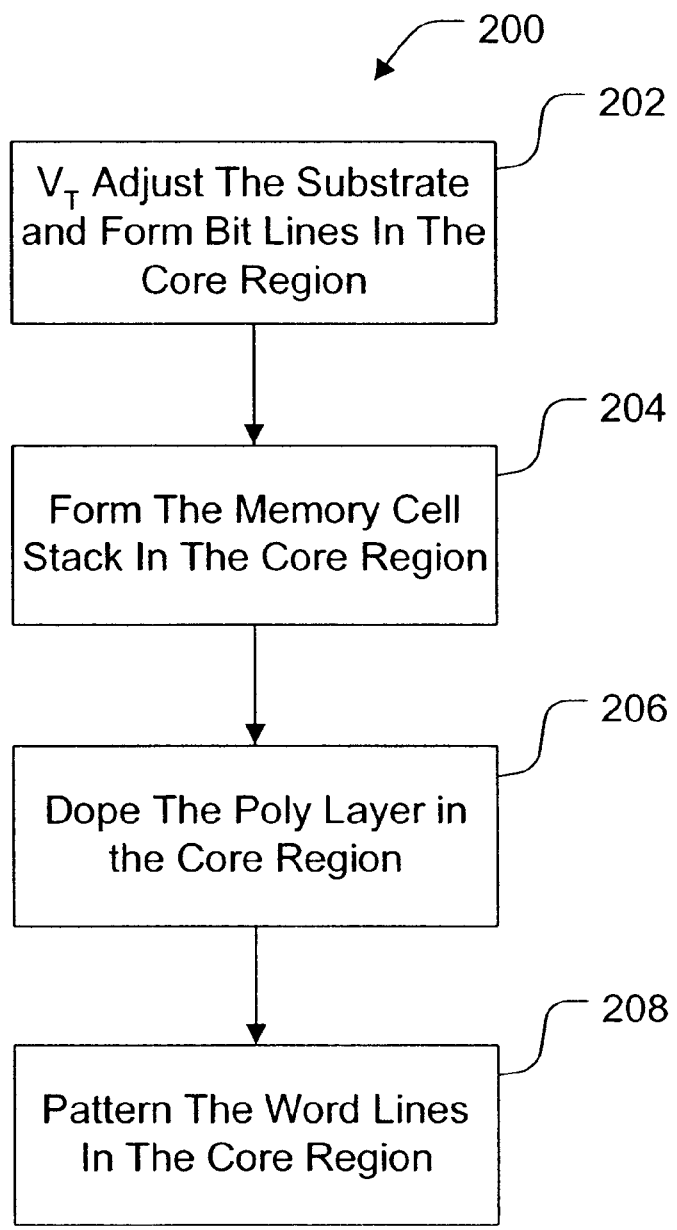
FIG. 2 is a flow chart of a method according to another aspect of the present invention.

FIG. 2 provides a flow chart showing certain actions in a process 200 in accordance with another aspect of the present invention. Process 200 can be employed in producing flash memory device 10 of FIG. 1. Act 202 is setting the threshold voltage, $V_T$, for the substrate and forming buried bit lines. The substrate is generally doped p-type while the bit lines are generally doped n-type. Where the memory cell stack includes a multilayer charge trapping dielectric, these doping steps can take place after the multilayer charge trapping dielectric is formed. The substrate doping can be carried out with a blanket doping, whereas the bit line doping generally involves doping through a lithographically patterned resist mask.

Act 204 is forming the memory cell stack in at least the core region. The memory cell stack can be either a SONOS type memory cell stack or a floating gate memory cell stack. Peripheral region gate stacks can be formed at the same time as the core memory cell stack, with portions of the core memory cell stack extending into the peripheral region. For example, it is common for at least an oxide layer and a poly layer to extend into the periphery.

Act 206 is doping the poly layer in at least the core region. The poly layer is the uppermost layer of the memory cell stack, which is later patterned into word lines. A poly layer is a layer containing polysilicon or amorphous silicon. According to one aspect of the invention, act 206 takes place prior to patterning, whereby the poly layer protects portions of the substrate between subsequently formed word lines from becoming doped while the word lines are being doped. Doping the poly layer increases its conductivity and facilitates formation of conductive silicide. While a doped poly layer can be deposited, doping the poly layer after deposition facilitates the formation of high performance memory devices. Optionally, the periphery can be masked while the poly layer is being doped.

Act 208 is patterning the poly layer in at least the core region to form word lines. The entire memory cell stack can be patterned at this time, whereby the substrate between word lines is exposed. Optionally, however, one or more layers of the memory cell stack can be left in between word lines. Gates of the peripheral region can also be patterned at this time.

Figure 3:
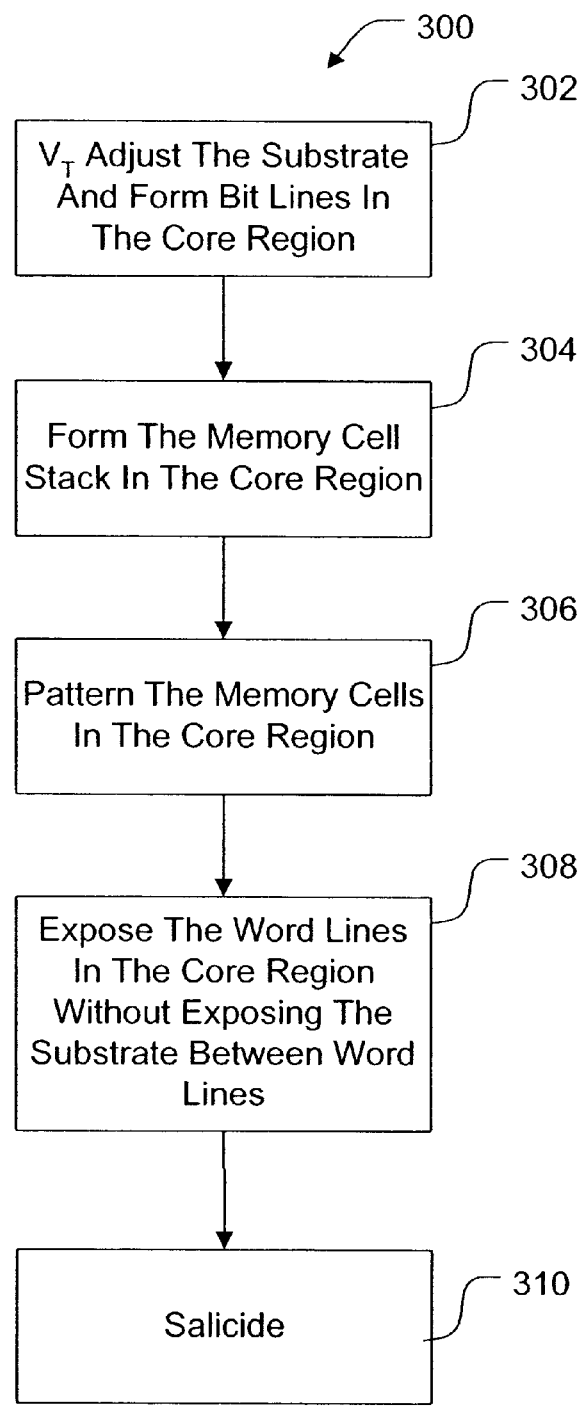
FIG. 3 is a flow chart of a method according to a further aspect of the present invention.

FIG. 3 provides a flow chart showing certain actions in a process 300 in accordance with a further aspect of the present invention. Process 300 can also be employed in producing flash memory device 10 of FIG. 1. Acts 302, 304, and 306, which include $V_T$ adjusting the substrate, forming bit lines in the core region, forming the memory cell stack, and patterning the memory cell stack, are similar to corresponding acts 202, 204, and 208 of process 200. In process 300, doping the control gate layer prior to patterning is optional. For example, the control gate layer may be formed by an in situ doping method, wherein the control gate layer is doped during formation.

Act 308 is exposing the word lines in the core region without exposing the substrate between word lines. The word lines may be covered, for example, by spacer material that is deposited during a process for forming source and drain regions adjacent gates in the peripheral region. The word lines may also be covered by a salicide protect layer, which is a dielectric or similar material deposited to cover the substrate between word lines and protect it during saliciding. Regardless, a layer of spacer material, dielectric material, or similar material covers the substrate between word lines and any such material on top of the word lines is removed without exposing the substrate between word lines. As an alternative to, or in addition to, a deposited layer, the substrate can be protected by one or more layers of the memory cell stack, which can be left in place when the word lines are patterned.

Act 310 is saliciding. A saliciding metal is deposited over the substrate by any suitable process. Rapid thermal annealing (RTA) is carried out under conditions wherein the saliciding metal reacts with silicon to form a metal silicide. Additional RTA can be employed to obtain the silicide in a desired phase. During the saliciding process, the substrate between word lines is protected from saliciding by a layer of spacer material, dielectric material, or similar material. Therefore, essentially no silicide forms on the substrate between word lines.

Figure 4:
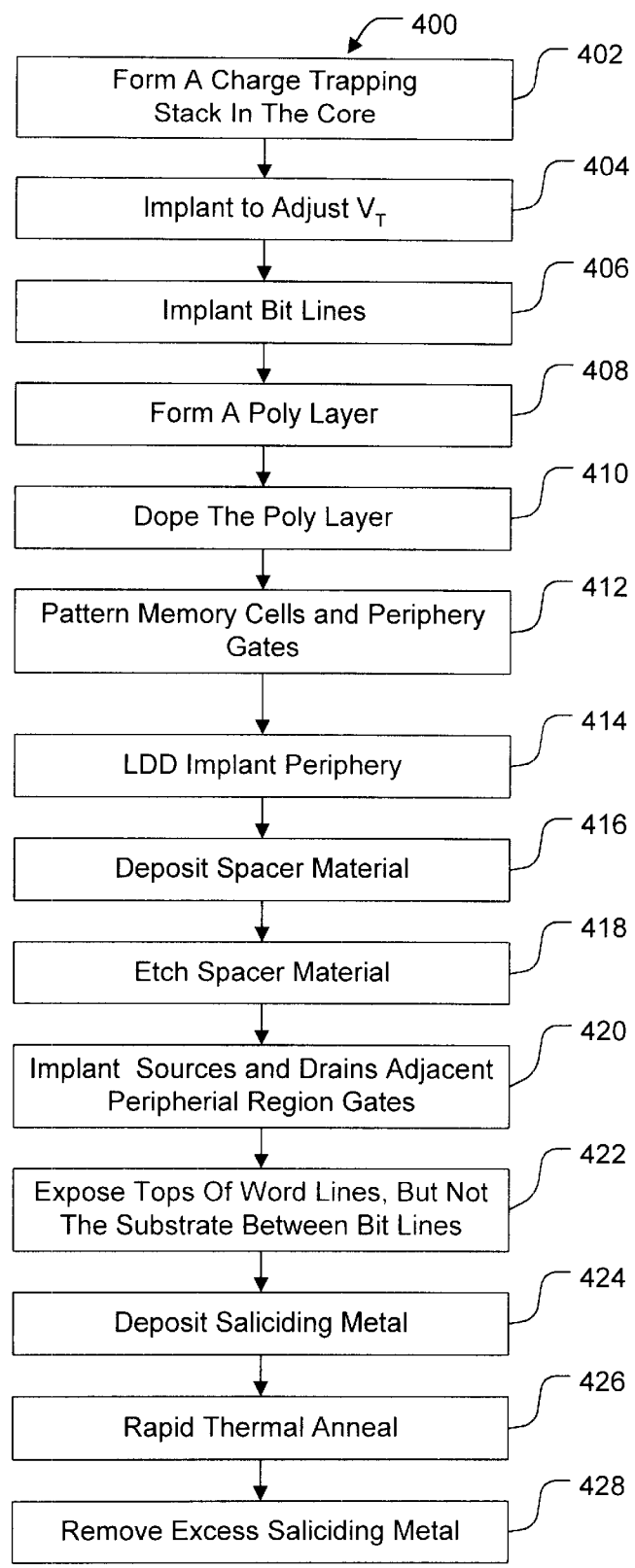
FIG. 4 is a flow chart of a method according to yet another aspect of the present invention.

FIG. 4 provides a flow chart of a more detailed example of a process 400 according to yet another aspect of the present invention. The sequence begins with act 402, forming a charge trapping dielectric stack over the core region of a substrate that includes a semiconductor. The semiconductor is generally silicon, but can be any suitable semiconductor, GaAs or InP for example.

Figure 5:
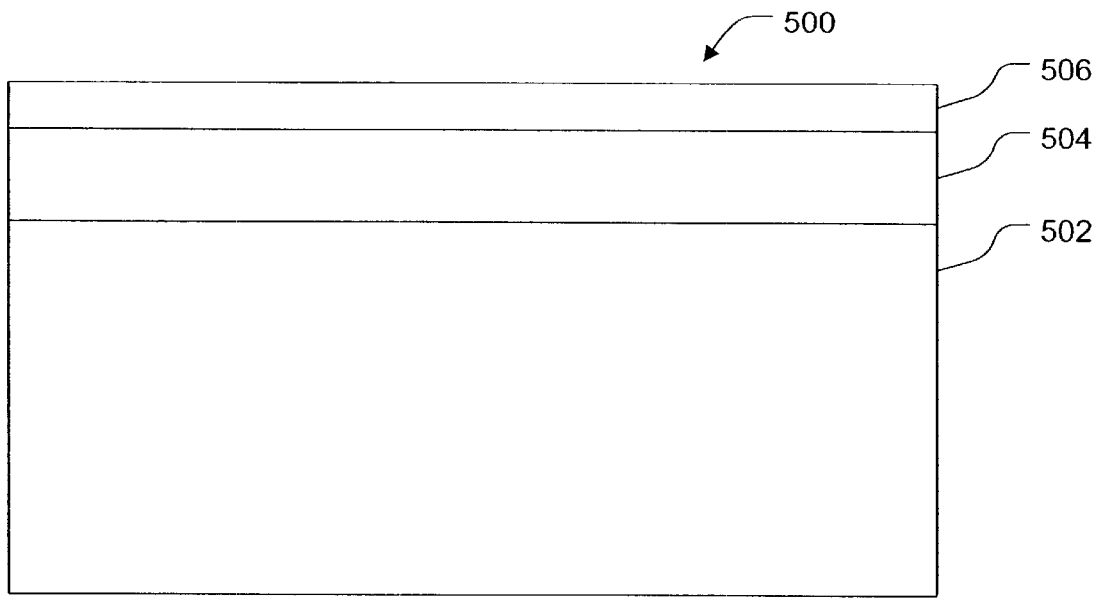
FIG. 5 illustrates the memory cell stack of a SONOS memory device.

The charge trapping dielectric stack can be the charge trapping portion of a SONOS memory cell stack. FIG. 5 provides an example of a SONOS memory cell stack 500.

SONOS memory cell stack 500 include a charge trapping dielectric 504 and a poly layer 506 formed over substrate 502. The charge trapping dielectric can be any dielectric layer or layers that are capable of or facilitate electron trapping. In other words, to facilitate electron trapping, the charge trapping dielectric has a layer with a lower barrier height than the layers sandwiching it (two layers with relatively higher barrier heights sandwiching a layer with a relatively lower barrier height). In the case of an ONO trilayer dielectric, the oxide layers have a barrier height of about 3.1 eV whereas the nitride layer has a barrier height of about 2.1 eV. In this connection, a well is created in the middle layer.

For example, charge trapping dielectrics include an ONO trilayer dielectric, an oxide/nitride bilayer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanate/barium strontium titanate trilayer dielectric ($SiO_2/SrTiO_3/BaSrTiO_2$), and the like (in each case, the first layer mentioned is the bottom layer while the last layer mentioned is the top layer). Although the term SONOS is suggestive of an ONO layer, as used herein the term encompasses nonvolatile memory devices containing any of the charge trapping dielectrics described above. In other words, a SONOS type nonvolatile memory device contains any dielectric layer or layers that are capable of or facilitate electron trapping, and does not require an ONO charge trapping dielectric.

Where the charge trapping dielectric is an ONO dielectric, one or both of the silicon dioxide layers can be a silicon-rich silicon dioxide layer. One or both of the silicon dioxide layers can also be an oxygen-rich silicon dioxide layer. One or both of the silicon dioxide layers can be a thermally grown or a deposited oxide. One or both of the silicon dioxide layers can be nitrided oxide layers.

A nitride layer can be a silicon-rich silicon nitride layer. The nitride can also be a nitrogen-rich silicon nitride layer. In one aspect of the invention, the charge trapping dielectric has a thickness from about 75 Å to about 300 Å. In another aspect of the invention, the charge trapping dielectric has a thickness from about 100 Å to about 275 Å. In a further aspect of the invention, the charge trapping dielectric has a thickness from about 110 Å to about 250 Å.

In one aspect of the invention, the oxide layers individually have thicknesses from about 50 Å to about 150 Å while the nitride layer has a thickness from about 20 Å to about 80 Å. In another aspect of the invention, the oxide layers individually have thicknesses from about 60 Å to about 140 Å while the nitride layer has a thickness from about 25 Å to about 75 Å. In a further aspect of the invention, the oxide layers individually have thicknesses from about 70 Å to about 130 Å while the nitride layer has a thickness from about 30 Å to about 70 Å.

While process 400 is primarily concerned with forming a SONOS type memory device, the invention can also be employed to form floating gate memory devices. If a floating gate memory device is to be formed, act 402, which involves forming the charge trapping layers of the memory cell stack, is postponed until after the threshold voltage for the substrate is set and buried bit lines are formed.

Figure 6:
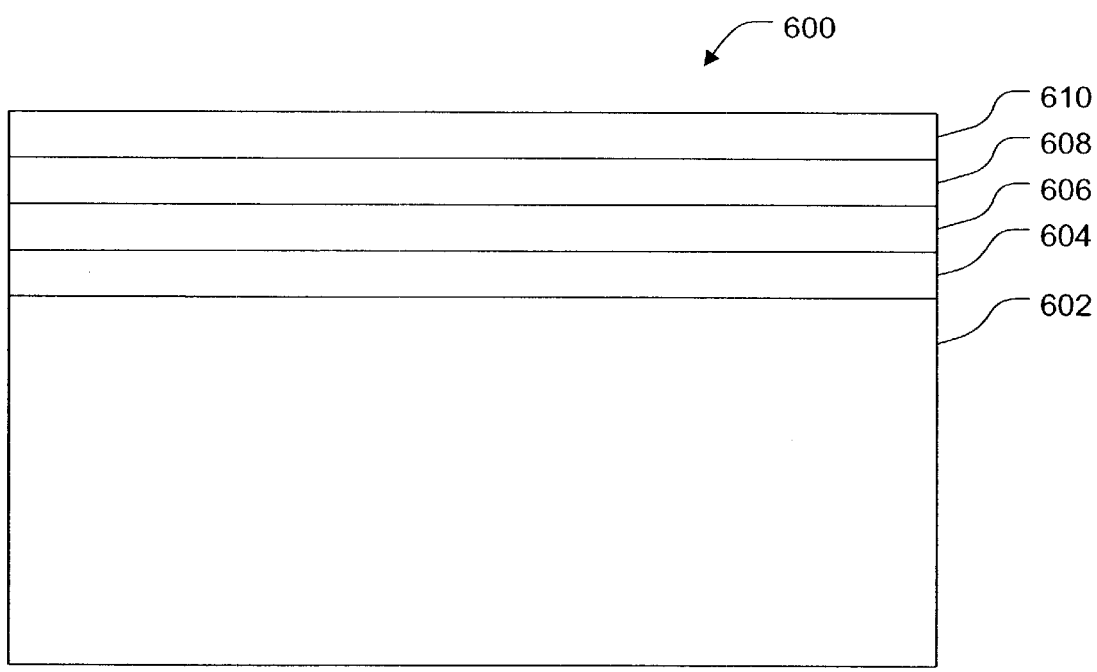
FIG. 6 illustrates the memory cell stack of a conventional floating gate memory device.

FIG. 6 provides an example of a stack 600 for floating gate memory cells. Gate oxide layer 604 is formed over semiconductor substrate 602. In one aspect of the invention, gate oxide layer 604 is about 30 Å to about 150 Å thick. In another aspect of the invention, gate oxide layer 604 is about 50 Å to about 110 Å thick.

Gate oxides can be formed by any suitable processes including chemical vapor deposition (CVD), dry oxidation, wet oxidation, or thermal oxidation. For example, the gate oxide layer 604 can be formed by dry oxidation at a temperature of about 1050° C., under an atmosphere containing 1.33 liters oxygen, 70 cc HCl and 12.6 liters argon.

Floating gate layer 606 is formed over gate oxide layer 604. Floating gate layer 606 generally contains polysilicon or amorphous silicon. Floating gate layer 606 can be formed in any suitable manner. For example, a phosphorus doped amorphous silicon layer can be deposited via CVD at 530° C., 400 mTorr, with 2000 sccm $SiH_4$, 22 sccm helium, and 1% by weight $PH_3$. In one aspect of the invention, floating gate layer 606 has a thickness of about 400 Å to about 1,200 Å. In another aspect of the invention, floating gate layer 606 has a thickness of about 500 Å to about 1,000 Å. In a further aspect of the invention, floating gate layer 606 has a thickness of about 600 Å to about 900 Å.

A dielectric layer 608 is formed over floating gate layer 606. Most commonly, this dielectric layer is a multilayer dielectric such as an oxide/nitride/oxide ("ONO") layer. The thickness is typically about 120 Å to about 400 Å. Generally speaking, an ONO layer is formed by successive formation of oxide, nitride and oxide layers. The ONO layers can have any suitable thicknesses. The first or bottom oxide layer can be, for example, from about 40 Å to about 60 Å thick. The nitride layer can be, for example, about 60 Å to about 100 Å thick, or from about 70 Å to about 90 Å thick. The top oxide layer can be, for example, from about 20 Å to about 80 Å thick, or about 40 Å to about 60 Å thick. One or more of the oxide layers can also form part of a peripheral region gate oxide.

Dielectric layer 608 can be formed by any suitable means. For example, to form an ONO layer, a bottom oxide layer can be formed using a CVD technique or grown using an oxidation technique. For example, a bottom oxide layer can be formed at a temperature of about 750° C. and a pressure of 600 mTorr with a gas containing 20 sccm $SiH_4$, 1200 sccm $N_2O$, and a carrier gas. An oxide layer can also be formed by depositing then oxidizing TEOS. A nitride layer can also be deposited using CVD techniques. For example, nitride is deposited at a temperature of about 760° C. and a pressure of 330 mTorr with a gas containing 600 sccm $NH_3$ and 100 sccm $SiH_2Cl_2$. The second or top oxide layer can be formed in a manner similar to or different from that employed in forming the first oxide layer. A poly layer 610 covers the charge trapping layers.

Peripheral region gate stacks are commonly formed, at least in part, at the same time as the core memory cell stack. Two oxide thicknesses are often employed in the periphery, one for low voltage gates and another for high voltage gates. The gate oxide layers in the periphery are typically thicker than in the core. For example, a gate oxide in the peripheral region can be about 130 Å to about 400 Å thick. Core and peripheral region gate oxides can be grown at the same time or at different times. Additional oxidation steps are employed in the peripheral regions where greater thickness of gate oxide is required.

After the charge trapping layers are formed, the substrate is doped to set the threshold voltage ($V_T$) in act 404. However, in some instances, it is possible to optionally perform act 404 before act 402. The substrate can be doped lightly (n− or p−) or heavily (n+ or p+). Examples of suitable dopants include one or more of arsenic, boron, and phosphorus. The doping can involve several layers or wells. Generally, the uppermost well is made p-type. As a specific example, boron can be implanted to a dosage of about $1\times10^{11}$ atoms per cm$^2$ to about $1\times10^{13}$ atoms per cm$^2$. The implant can be carried out with an energy of about 80 kev to about 300 KeV.

Act 406 is forming buried bit lines. Buried bit lines are formed by doping the substrate. Suitable dopants again include one or more of arsenic, boron, $BF_2^+$, antimony, indium, and phosphorus, although the dopant used to form the buried bit lines is of opposite type from that used to set the threshold voltage for the substrate. In one embodiment, the bit lines are implanted to a dosage from about $1\times10^{14}$ to about $1\times10^{16}$ atoms/cm$^2$. In another embodiment, the bit lines are implanted to a dosage from about $5\times10^{14}$ to about $7\times10^{15}$ atoms/cm$^2$. In yet another embodiment, the bit lines are implanted to a dosage from about $1\times10^{15}$ to about $5\times10^{15}$ atoms/cm$^2$. Optionally, the bit lines can be implanted prior to setting the threshold voltage for the substrate.

Act 408 is forming a poly layer over at least the core region. The poly layer contains amorphous silicon or polysilicon. In one aspect of the invention, the poly layer has a thickness of about 500 Å to about 6000 Å. In another aspect of the invention, the poly layer has a thickness of about 750 Å to about 3000 Å. In a further aspect of the invention, the poly layer has a thickness of about 1,000 Å to about 1,500 Å. The poly layer can be formed by any suitable means, including the type of means used to form the floating gate layer of a floating gate memory cell stack. The poly layer generally extends over the peripheral region. Any core region memory cell stack layers that are not wanted in the peripheral region can be selectively formed in the core region or selectively etched from the peripheral region with one or more lithographic masks.

Act 410 is doping the poly layer in at least the core region. Any suitable dopant can be used, arsenic for example. In one aspect of the invention, the poly layer is doped with about $1\times10^{11}$ to about $1\times10^{16}$ atoms/cm$^2$. In another aspect of the invention, the poly layer is doped with about $1\times10^{13}$ to about $5\times10^{15}$ atoms/cm$^2$. In a further aspect of the invention, the poly layer is doped with about $3\times10^{14}$ to about $3\times10^{15}$ atoms/cm$^2$. Optionally, the peripheral region is masked while the poly layer is being doped in the core region.

In some instances, act 408 and act 410 can be performed simultaneously. In these instances, in situ doping formation techniques may be employed.

Act 412, which takes place after doping the poly layer in the core region, is patterning the core memory cells and peripheral region gates. Patterning can be carried out with any suitable method, including, for example, a lithographic process. Patterning the core memory cells involves patterning at least the poly layer. The patterning divides the poly layer of the core region into spaced apart word lines. In one aspect of the invention, patterning provides a spacing between word lines, except where contacts are placed, from about 0.05 μm to about 1.5 μm. In another aspect of the invention, the spacing between word lines is from about 0.1 μm to about 1 μm. In a further aspect of the invention, the spacing between word lines is from about 0.15 μm to about 0.75 μm. The widths of the word lines are comparable to the spaces between word lines.

Acts 414, 416, 418, and 420 provide source and drain regions adjacent gates in the peripheral region. During these optional steps, n-type and p-type transistors are masked and implanted separately. The core is masked during at least during acts 414 and 420, which involve doping. Optional act 414 is an optional self aligned LDD implant. This implant provides a dosage of about $1\times10^{11}$ atoms/cm$^2$ to about $1\times10^{13}$ atoms/cm$^2$ at an energy of about 20 KeV to about 80 KeV. Suitable dopants can include, for example, arsenic, boron, or phosphorus. Act 414 is optional to the extent that an LDD doping for peripheral region gates can be provided when the poly layer is doped in act 410. In one embodiment, act 410 and act 414 are performed at the same time and after act 412.

Optional act 416 is depositing a spacer material. Any suitable material can be used, including a nitride and/or an oxide, for example. An oxide layer can be formed by depositing then oxidizing TEOS. Using CVD techniques, a nitride layer can also be deposited. Any masks are normally removed prior to depositing the spacer material, whereby the spacer material generally deposits directly over and between the word lines of the core region.

Optional act 418 is etching the spacer material. All of the spacer material across the substrate may be etched at once, or the core may be initially masked while the spacers in the periphery are etched followed by masking the periphery and etching the spacers in the core, or the periphery may be initially masked while the spacers in the core are etched followed by masking the core and etching the spacers in the periphery. Any suitable etching process can be used that leaves a comparatively thick layer of spacer material to the sides of the peripheral region gates, while leaving a thin layer of spacer material or no spacer material in spaces between peripheral region gates. The etching process is usually an anisotropic etching process, such as reactive ion etching. Choice of a suitable process and reagents depends on the spacer material. Reactive ion etching can be carried out with $CF_4$, for example. Wet etching can be carried out with an acid, a base, or a solvent. Acids that can be employed include hydrofluoric acid, hydrobromic acid, nitric acid, phosphoric acid or acetic acid. Bases that can be employed include hydroxides such as sodium hydroxide, ammonium hydroxide, and potassium hydroxide. Solvents can be polar, such as water, or non-polar, such as xylene or cellusolve, or of intermediate polarity, such as alcohols including methanol.

Act 420 is doping to provide source and drain regions adjacent gates in the periphery. The spacers limit the concentration of dopant immediately adjacent the gates. N-type and p-type gates are doped separately. In one aspect of the invention, the dopants are implanted to a dosage from about $1\times10^{14}$ to about $1\times10^{16}$ atoms/cm$^2$. In another aspect of the invention, the dopants are implanted to a dosage from about $5\times10^{14}$ to about $7\times10^{15}$ atoms/cm$^2$. In a further aspect of the invention, the dopants are implanted to a dosage from about $1\times10^{15}$ to about $5\times10^{15}$ atoms/cm$^2$.

Act 422, which is carried out prior to saliciding, is removing any material on the tops of the word lines, particularly spacer material, while leaving a protective layer over the substrate between word lines in the core region. Optionally, the periphery is also masked during act 422. A spacer or dielectric material over the word lines can be removed by chemical, mechanical, or combined chemical and mechanical means. Chemical removal includes wet etching. Additional examples of chemical removal include plasma and reactive ion etching. The plasma can be of oxygen, fluorine, chlorine, hydrogen, or a combination of these, optionally with other gases. Reactive ion etching can be done with oxygen, for example. Combined chemical and mechanical means include chemical mechanical polishing (CMP). CMP uses a material, often referred to as a slurry, that does not rapidly dissolve the layer being removed, but modifies its chemical bonding sufficiently to facilitate mechanical removal with a polishing pad. Material can also be removed by purely mechanical means. A polishing pad attached to a rigid flat surface can be moved against the upper layer to gradually remove an amount of material appropriate to expose the tops of the word lines. Providing a protective layer over the substrate in the spaces between word lines can be facilitated by masking those areas during one or more dielectric or spacer etching steps taking place prior to act 422.

Acts 424, 426, and 428 relate to the saliciding process. This process forms a silicide on exposed silicon, including at least the word lines of the core region. Generally, the silicide is also formed in the source and drain regions of the periphery. A silicide is a compound of Si and a metal. Any suitable metal can be employed, including metals of the Group IVA, VA, and VIII. Specific examples include Ti, Ni, or Co, forming compounds such as $TiSi_2$, NiSi, and $CoSi_2$.

In act 424, metal is deposited over the surface. The metal can be deposited by any suitable means, including, for example, evaporation, sputtering, and CVD. In the evaporation method, a metal film is deposited by condensation of a vapor on the substrate, which is maintained at a lower temperature than the vapor. The metal can be vaporized by any suitable method, including, for example, resistive heating, inductive heating, laser bombardment, or laser heating.

In sputter-deposition, the metal to be deposited is bombarded by energetic ions to free some atoms. These atoms are condensed on the substrate to form the film. In CVD, the metal is produced by one or more reactions occurring either in the vapor phase or at the surface of the substrate. The reactions are generally induced by heat, which causes either a decomposition of the metal containing compound or reaction between the different species. Metal organic compounds are useful in CVD processes.

Once the metal is deposited, silicide is formed in act 426 by RTA. RTA is employed because it induces chemical reactions and phase changes while avoiding prolonged heating of the substrate that could cause undo diffusion of the metal or dopants. RTA is generally accomplished with lasers, heat lamps, such as arc or tungsten-halogen lamps, although other suitable apparatus can be employed, including an electrically heated bell jar and in some cases, a furnace. The temperature depends on, among other factors, the type of silicide being formed.

Annealing of titanium silicide often involves two RTA steps. The first RTA is at a temperature from about 500 to about 700° C. and results in the formation of the relatively high resistivity C49 $TiSi_2$ phase. For example, RTA at 650° C. for 30 seconds can be employed. A selective etch can be used to remove un-reacted metal on the sidewall spacer and isolate gates from the source/drain regions. A second RTA at a temperature from about 700 and about 900° C. transforms the relatively high resistivity C49 $TiSi_2$ phase to the relatively low resistivity phase C54 $TiSi_x$. The atmosphere ($N_2$, level of vacuum, etc.) and impurities can affect the competing kinetics and vary the optimum anneal time and temperature.

$CoSi_2$ is also commonly formed with two RTA steps. TiN capping can be employed to prevent oxidation of Co and provide a smooth film. For example, a Co film can be sputter-deposited, followed by TiN film deposition while maintaining a vacuum. After a first RTA, the TiN cap is etched off using ammonium hydroxide solution. The un-reacted Co layer on $SiO_2$, or other spacer material, is selectively etched off using hydrochloric acid solution. A second RTA converts CoSi to $CoSi_2$.

Act 428 removes any un-reacted metal that could form unwanted compounds in later processing steps. Un-reacted metal can be removed by any suitable means. Generally, the metal is removed by washing with an acid solution. For example, a solution of hydrochloric and/or nitric acid can be employed. Although not shown, further processing is performed to complete the fabrication of the flash memory device.

FIGS. 7 to 13 schematically illustrate the formation of the core region in a SONOS flash memory device with virtual ground array structure according to the present invention. The device formed has an NOR structure in that the bit lines are connected in parallel and form continuous strips in the core region. In this example, the bit lines run perpendicular to the word lines.

Figure 7:
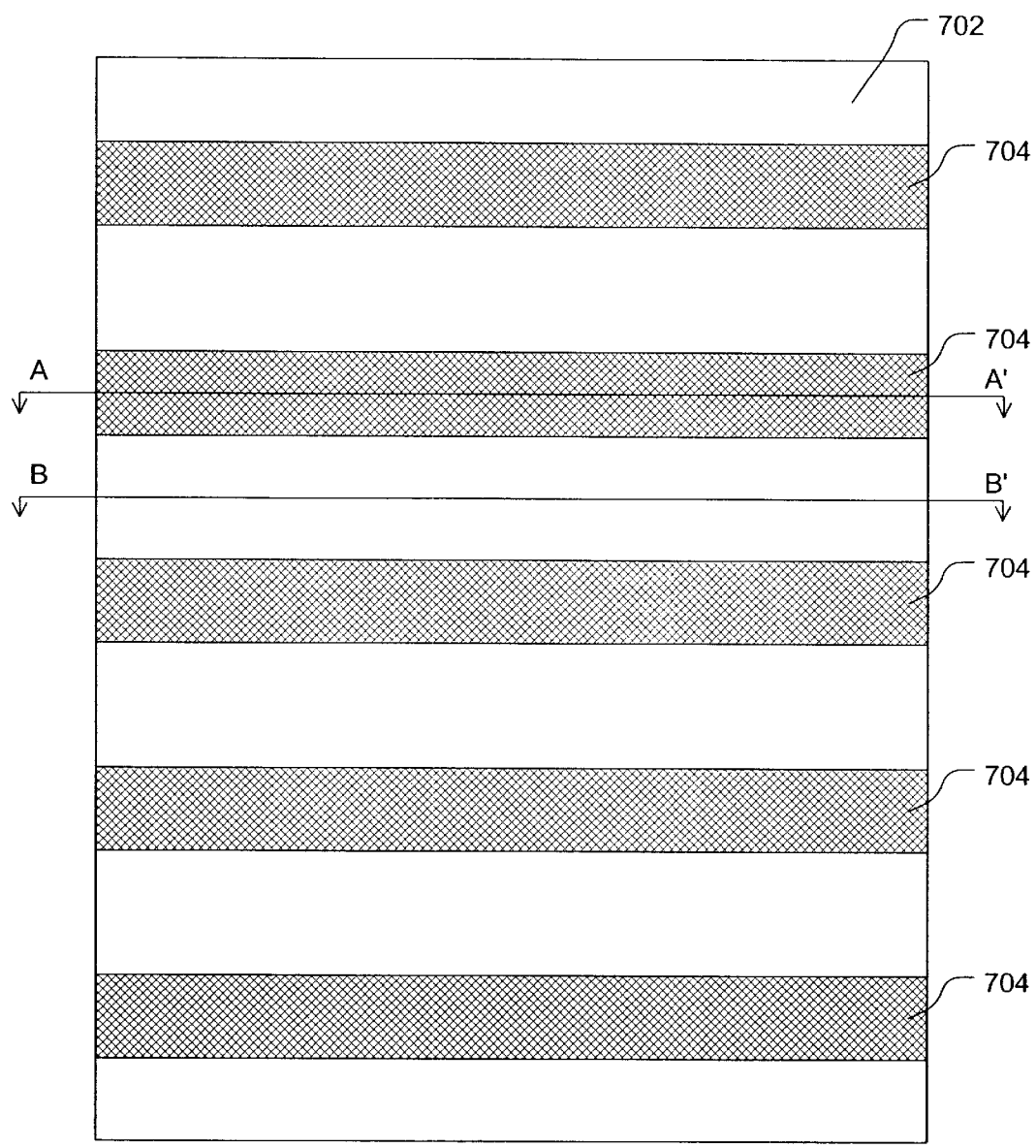
FIG. 7 illustrates the core region of a partially formed memory device according to a still further aspect of the present invention.
Figure 8:
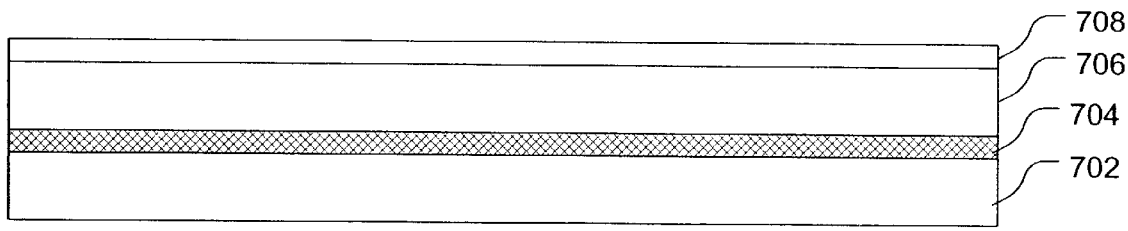
FIG. 8 is a view along line AA' of FIG. 7 after forming a memory cell stack.
Figure 9:
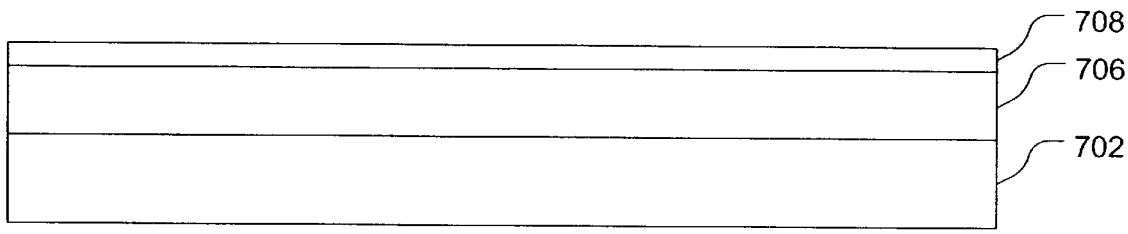
FIG. 9 is a view along line BB' of FIG. 7 after forming the memory cell stack.

FIG. 7 illustrates a semiconductor substrate 702 after $V_T$ adjusting and forming buried bit lines 704. FIGS. 8 and 9, correspond to cross-sections along line AA' and BB' of FIG. 7 after forming a memory cell stack. The memory cell stack includes charge trapping layers 706 and poly layer 708. Poly layer 708 is doped at this stage, which is prior to patterning.

Figure 10:
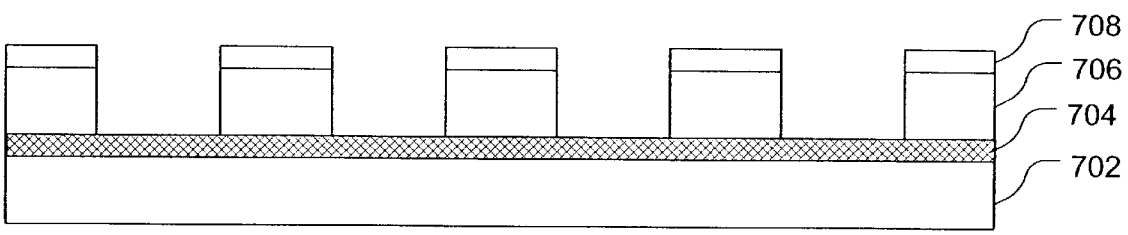
FIG. 10 is a view along line AA' of FIG. 7 after patterning the memory cell stack.
Figure 11:
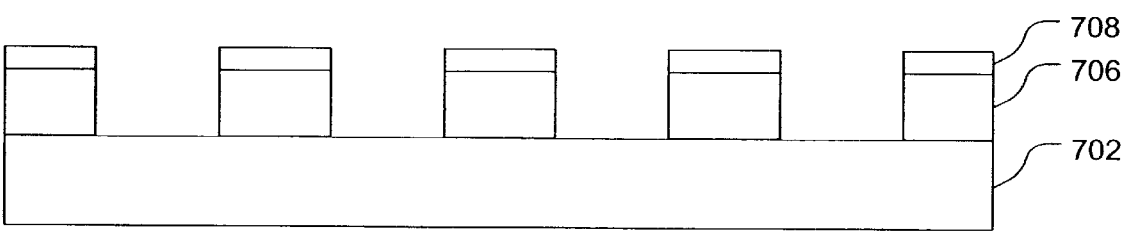
FIG. 11 is a view along line BB' of FIG. 7 after patterning the memory cell stack.
Figure 12:
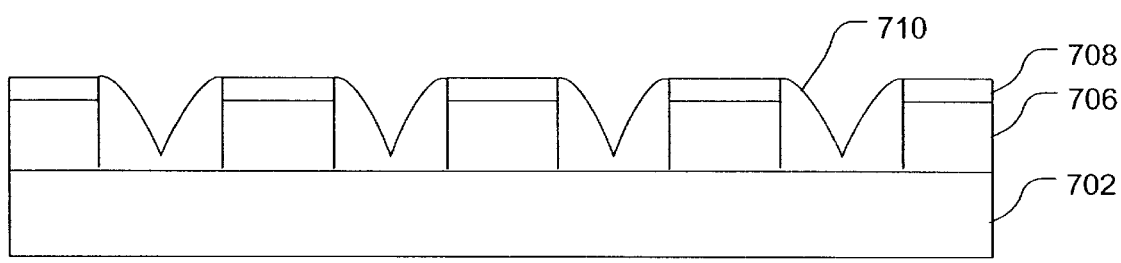
FIG. 12 is a view along line AA' of FIG. 7 immediately prior to saliciding.

FIGS. 10 and 11 provide cross-sectional illustrations along line AA' and BB' after patterning the memory cell stacks into elongated strips, forming word lines. The charge trapping layers 706 need not be patterned at this stage, although they have been patterned in the illustrations. Whether or not the charge trapping layers have been patterned away, the spaces between word lines can be partially or entirely filled with spacer oxide 710 as illustrated in FIG. 12. The spacer oxide can be deposited during the process of doping source and drain regions for gates of the peripheral region. Alternatively, these spaces can be filled with a dielectric material deposited to protect the substrate between word lines from saliciding. Any material on top of the word lines is removed to provide the structure illustrated by FIG. 12.

Figure 13:
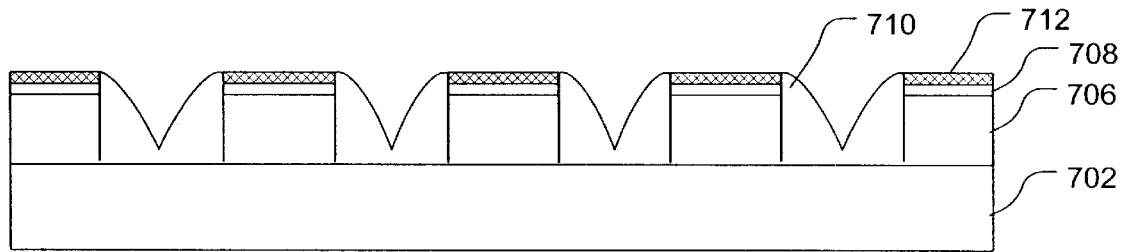
FIG. 13 is a view along line AA' of FIG. 7 after saliciding.

Once the tops of the word lines are exposed, the word lines can be salicided. The saliciding metal reacts with at least a portion of poly layer 708. The resulting structure, with silicide 712, is illustrated in FIG. 13.

Although the invention has been shown and described with respect to a certain preferred embodiment or embodiments, it is obvious that equivalent alterations and modifications will occur to those skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a virtual ground array non-volatile semiconductor memory device, comprising:

providing a semiconductor substrate having a core region and a peripheral region, wherein oxide islands are not formed in the core region;

forming charge trapping layers comprising at least one dielectric layer over the core region;

forming a poly layer over at least the charge trapping layers;

prior to patterning the poly layer in the core region, doping the poly layer in the core region;

patterning the poly layer in the core region to form word lines;

masking the core region;

while the core region is masked and prior to saliciding the word lines, doping the substrate to form source and drain regions adjacent gates in the peripheral region; and saliciding the word lines, wherein the source and drain regions adjacent the gates in the peripheral region are salicided at the same time as the word lines in the core region.

2. The method of claim 1, wherein the core region comprises buried bit lines.

3. The method of claim 2, wherein the virtual ground array non-volatile semiconductor memory device has a NOR device structure.

4. The method of claim 1, wherein the virtual ground array non-volatile semiconductor memory device comprises a SONOS memory device.

5. A method of forming a virtual ground array non-volatile semiconductor memory device, comprising:

providing a semiconductor substrate having a core region and a peripheral region, wherein oxide islands are not formed in the core region;

forming charge trapping layers comprising at least one dielectric layer over the core region;

forming a poly layer over at least the charge trapping layers;

patterning the poly layer in the core region to form word lines spaced apart on the substrate; and saliciding the word lines, wherein the source and drain regions adjacent the gates in the peripheral region are salicided at the same time as the word lines in the core region.

6. The method of claim 5, wherein the core region comprises buried bit lines.

7. The method of claim 6, wherein the virtual ground array non-volatile semiconductor memory device has a NOR device structure.

8. The method of claim 5, wherein the virtual ground array non-volatile semiconductor memory device comprises a SONOS memory device.

9. The method of claim 5, wherein at least the dielectric layer protects the semiconductor substrate in the spaces between word lines from becoming salicided while the word lines are salicided.

10. The method of claim 5, wherein at least a layer of spacer material protects the semiconductor substrate in the spaces between word lines from becoming salicided while the word lines are salicided.

* * * * *